(12) United States Patent
Lin

(10) Patent No.: US 8,981,528 B2
(45) Date of Patent: *Mar. 17, 2015

(54) GAN-BASED SCHOTTKY DIODE HAVING PARTIALLY RECESSED ANODE

(71) Applicant: Vishay General Semiconductor LLC, Hauppauge, NY (US)

(72) Inventor: Yih-Yin Lin, Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/678,570

(22) Filed: Nov. 16, 2012

(65) Prior Publication Data

US 2014/0138697 A1    May 22, 2014

(51) Int. Cl.
*H01L 29/66* (2006.01)
*H01L 29/872* (2006.01)
*H01L 29/20* (2006.01)

(52) U.S. Cl.
CPC .......... *H01L 29/872* (2013.01); *H01L 29/2003* (2013.01); *H01L 29/66143* (2013.01)
USPC .............................................. 257/543

(58) Field of Classification Search
USPC ............................ 257/76, E21.371, E21.387, 257/E21.403–E21.407, E21.441, E21.445, 257/E21.448–E21.452, 552–562, E29.033, 257/125, 164, 198, 514, 192, 194, 285, 257/E29.246–E29.253, E21.395, E21.399, 257/9–39, E39.003, E39.012–E39.015, 257/E29.042, E29.179; 438/235–238, 172, 438/297, 266, 400, 558, 674
See application file for complete search history.

(56) References Cited

U.S. PATENT DOCUMENTS

| | | | |
|---|---|---|---|
| 8,704,295 | B1 | 4/2014 | Darwish et al. |
| 2007/0132037 | A1* | 6/2007 | Hoshi et al. ............ 257/396 |
| 2008/0217625 | A1* | 9/2008 | Kuroda et al. ............ 257/76 |
| 2008/0217725 | A1 | 9/2008 | Tu et al. |
| 2009/0309181 | A1 | 12/2009 | Hsieh |
| 2010/0289109 | A1 | 11/2010 | Henning et al. |
| 2010/0314707 | A1 | 12/2010 | Yedinak et al. |
| 2012/0037982 | A1 | 2/2012 | Yedinak et al. |
| 2012/0098082 | A1 | 4/2012 | Hsu et al. |
| 2012/0181652 | A1 | 7/2012 | Qu et al. |
| 2012/0187478 | A1 | 7/2012 | Takaya |

(Continued)

FOREIGN PATENT DOCUMENTS

| | | |
|---|---|---|
| JP | 2009-525776 | 10/2009 |
| JP | 2010-205833 | 9/2010 |

(Continued)

*Primary Examiner* — Dao H Nguyen
*Assistant Examiner* — Tram H Nguyen
(74) *Attorney, Agent, or Firm* — Stuart H. Mayer; Karin L. Williams; Mayer & Williams PC

(57) ABSTRACT

A semiconductor device such as a Schottky diode is provided which includes a substrate, a first active layer disposed over the substrate and a second active layer disposed on the first active layer. The second active layer has a higher bandgap than the first active layer such that a two-dimensional electron gas layer arises between the first active layer and the second active layer. A first electrode has a first portion disposed in a recess in the second active layer and a second portion disposed on the second active layer such that a Schottky junction is formed therewith. A second electrode is in contact with the first active layer. The second electrode establishes an ohmic junction with the first active layer.

20 Claims, 9 Drawing Sheets

(56) References Cited

U.S. PATENT DOCUMENTS

| | | |
|---|---|---|
| 2012/0205772 A1 | 8/2012 | Chen |
| 2012/0241898 A1 | 9/2012 | Ohta et al. |
| 2012/0280281 A1* | 11/2012 | Bahl ............................. 257/201 |
| 2013/0009165 A1* | 1/2013 | Park et al. ...................... 257/76 |
| 2013/0015460 A1* | 1/2013 | Chen et al. ..................... 257/76 |
| 2013/0200451 A1 | 8/2013 | Yilmaz, Hamza et al. |
| 2013/0248874 A1* | 9/2013 | Kuraguchi ...................... 257/76 |
| 2013/0256679 A1* | 10/2013 | Yao et al. ........................ 257/76 |

FOREIGN PATENT DOCUMENTS

| | | |
|---|---|---|
| KR | 10-2007-0092473 | 9/2007 |
| KR | 10-2010-0122281 | 11/2010 |

* cited by examiner

GAN-BASED SCHOTTKY DIODE HAVING PARTIALLY RECESSED ANODE

BACKGROUND

A Schottky diode is a semiconductor device formed by a metal contacting a semiconductor layer. The junction between the metal and the semiconductor layer forms a rectifying junction with improved diode switching capability as compared to p-n junction diodes formed entirely in a semiconductor layer. Schottky diodes thus have lower turn-on voltages and faster switching speeds as compared to p-n junction diodes. Schottky diodes are ideal for applications where switching loss is the major source of energy consumption, such as in switch-mode power supplies (SMPS).

Electronic devices made from nitride-based compound semiconductor materials are known. Such electronic devices are also known as III-Nitride semiconductor devices as being formed from Group III nitride based materials. Nitride-based compound semiconductor devices are desirable for their wider band gap and higher breakdown voltage characteristics, rendering them suitable for high voltage and high temperature applications. In particular, III-V gallium nitride (GaN) compound semiconductor Schottky diodes having a high breakdown voltage and a low on-resistance have been described. The efficiency of switch-mode power supplies can be improved through the use of III-Nitride semiconductor Schottky barrier diodes.

III-nitride based semiconductor devices are capable of maximizing electron mobility by forming a 2-dimensional electron gas at the hetero-interface of two different III-nitrides such as AlGaN and GaN. The 2-dimensional electron gas is believed to compensate for the strain-induced piezoelectric polarization charges and spontaneous polarization charges arising from the non-ideal nature of the III-nitride crystal structure. The 2-dimensional electron gas is quantum-confined in the band bending region of a hetero junction where a narrower bandgap III-nitride (e.g., GaN) joins a larger bandgap III-nitride (e.g., AlGaN). Thus in a Schottky-like diode, electrons will flow along a confined channel between the anode electrode and the cathode electrode. The charge density is determined by hetero-structure parameters such as the Al composition, AlGaN layer thickness, and inherent crystal polarity. In III-nitride power devices, the charge density will respond to the applied gate voltage and can be removed locally according to changes in the energy band gaps. Therefore, the switching speed of III-nitride power devices can be very rapid.

FIG. 1 shows an example of a GaN-based Schottky diode. The diode 100 includes a substrate 10, a GaN layer 30 formed on the substrate and an AlGaN layer 40 formed on the GaN layer 30. An anode 60 and cathode 70 serve as electrical contacts for the device. The anode 60 is formed on the AlGaN layer 40 and establishes a Schottky interface therewith. The cathode 70 is formed on the GaN layer 30 and establishes an ohmic contact therewith.

One problem with Schottky diodes such as the device shown in FIG. 1 is that they often have a high forward voltage drop. This problem occurs because the conducting current has to travel through the relatively large potential barrier established by the Schottky contact on the AlGaN layer. For instance, the potential barrier of a Schottky contact formed by a Ni/Au metal on an AlxGaN layer is about 1.1 eV, whereas the potential barrier of a high voltage silicon-based Schottky diode is about 0.7 eV, which results in a significantly lower forward voltage drop.

SUMMARY

In accordance with one aspect of the invention, a semiconductor device is provided which includes a substrate, a first active layer disposed over the substrate and a second active layer disposed on the first active layer. The second active layer has a higher bandgap than the first active layer such that a two-dimensional electron gas layer arises between the first active layer and the second active layer. A first electrode has a first portion disposed in a recess in the second active layer and a second portion disposed on the second active layer such that a Schottky junction is formed therewith. A second electrode is in contact with the first active layer. The second electrode establishes an ohmic junction with the first active layer.

In accordance with another aspect of the invention, a method is provided of forming a semiconductor device. The method includes forming a first active layer on a substrate and a second active layer over the first active layer. The second active layer has a higher bandgap than the first active layer such that a two-dimensional electron gas layer arises between the first active layer and the second active layer. A first electrode is formed on the second active layer such that a Schottky junction is formed therewith. The first electrode has a first portion in contact with the two-dimensional gas and a second portion disposed on the second active layer. A second electrode is formed on the first active layer to form an ohmic junction therewith.

DETAILED DESCRIPTION

It has been found that the relatively high voltage drop of a GaN-based Schottky diode can be reduced by reducing the relatively large potential barrier established by the Schottky contact on the AlGaN layer. This can be accomplished by using a recessed anode in which the anode is formed directly on the GaN layer by removing the AlGaN layer. By recessing the anode in this manner the carriers can travel directly from the two-dimensional channel to the anode by thermionic emission without traveling across the AlGaN barrier, thereby increasing the current by reducing the potential barrier. Since the potential barrier is reduced, the forward voltage drop of the device is reduced. Unfortunately, as demonstrated below, the complete removal of the AlGaN layer also results in a decrease in the blocking voltage.

As detailed below, the forward voltage drop of a gallium nitride-based Schottky diode is reduced while simultaneously increasing its reverse blocking voltage by using a Schottky anode that is partially recessed. The portion of the anode that is recessed reduces the potential barrier of the Schottky contact, thereby reducing the forward voltage drop of the device. When a reverse bias is applied to the device, the portion of the anode that is not recessed produces a charge depletion region directly below it, blocking the flow of the two-dimensional electron gas, which improves the reverse blocking capability of the device.

Figure 1:
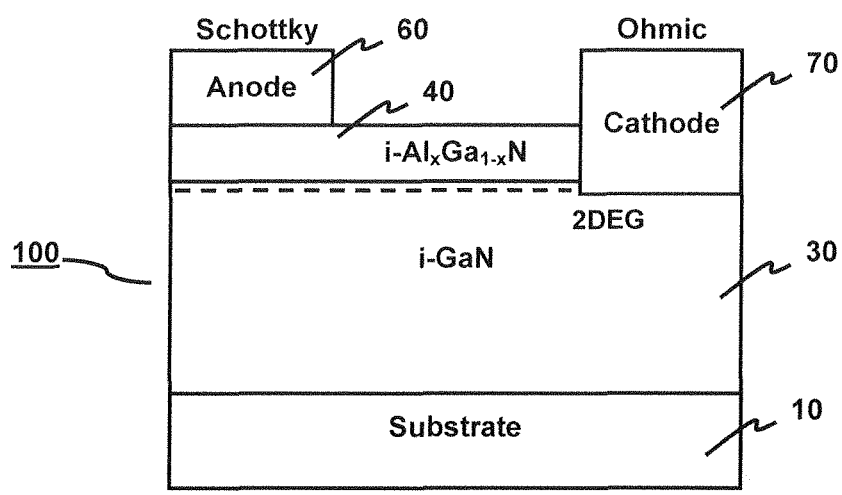
FIG. 1 shows an example of a GaN-based Schottky diode.
Figure 2:
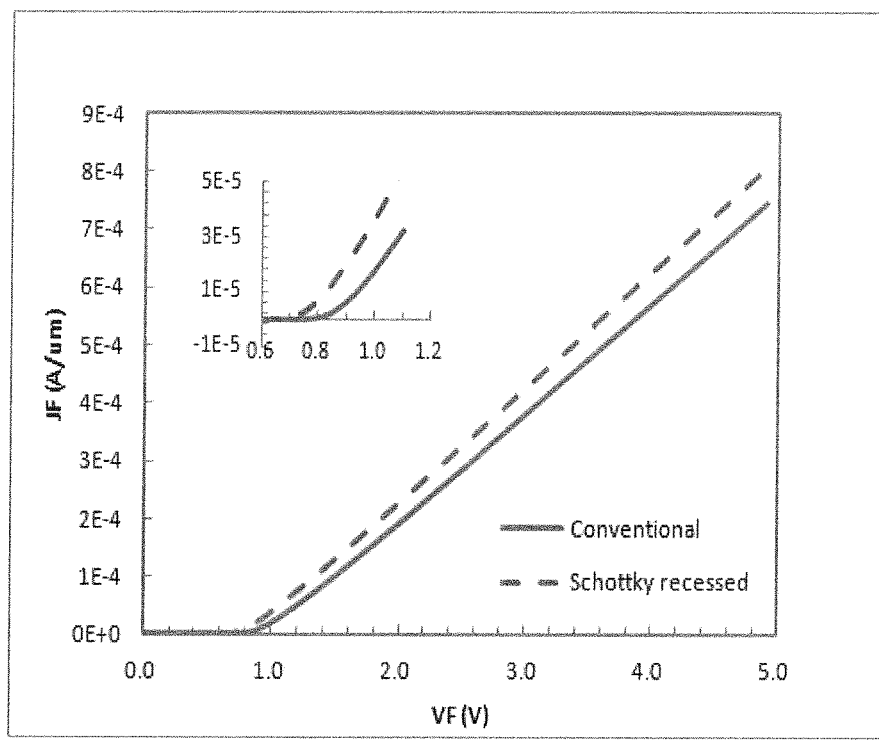
FIG. 2 shows a simulation of the forward current voltage (I-V) curves for a conventional AlGaN/GaN Schottky diode and a Schottky diode which has a fully recessed anode.

FIG. 2 shows a simulation of the forward current voltage (I-V) curves for a conventional AlGaN/GaN Schottky diode and a Schottky diode which has a fully recessed anode (which for brevity will be referred to herein as a fully recessed Schottky diode). The voltage onset point is magnified in the corner of the figure. In both cases the AlGaN layer is 25 nm thick with an Al composition of 25%, the GaN layer is an epitaxial layer 0.5 microns thick and the two-dimensional charge density is $8\times10^{-12}$ cm$^{-2}$ at the AlGaN/GaN interface. As shown, not only does the turn-on voltage decrease by about 0.1 ev, but the on-resistance is also reduced for the fully recessed Schottky diode.

Figure 3:
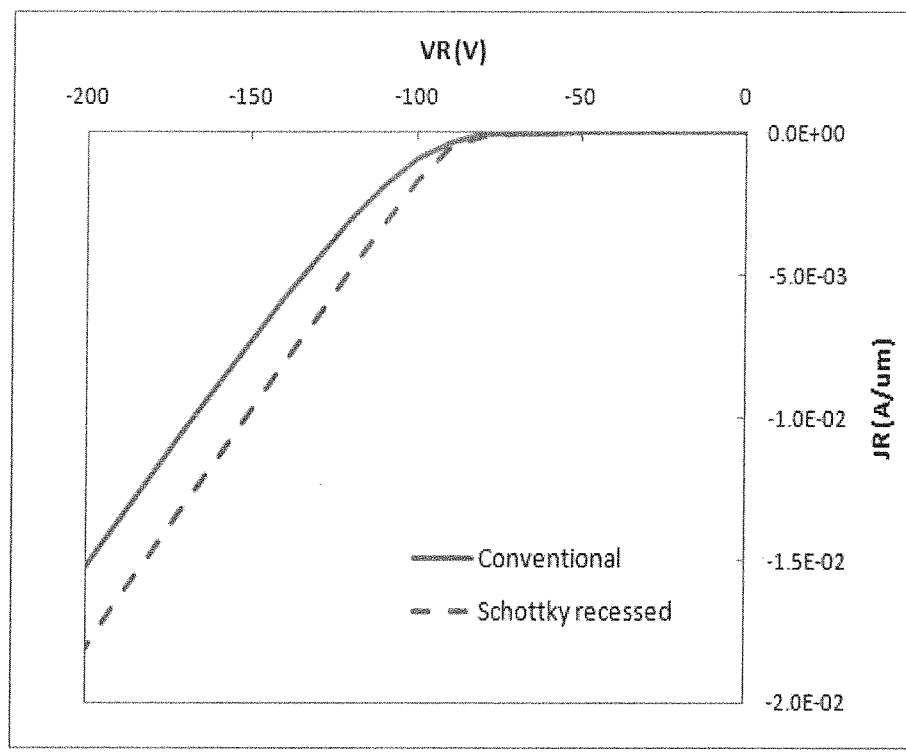
FIG. 3 shows a simulation of the reverse I-V curves for the conventional AlGaN/GaN Schottky diode and a fully recessed Schottky diode.

FIG. 3 shows a simulation of the reverse I-V curves for the conventional AlGaN/GaN Schottky diode and the fully recessed Schottky diode. As shown, when a reverse bias is applied to the devices, the fully recessed Schottky diode has a reduced breakdown voltage and a greater leakage current relative to the conventional Schottky diode.

In summary, taken together FIGS. 2 and 3 indicate that although a fully recessed anode can advantageously reduce the turn-on voltage, it unfortunately also reduces the breakdown voltage of the device because of the reduction in thickness of the AlGaN layer.

To overcome this problem, a Schottky diode is provided which employs a partially recessed anode in which one part of the anode is located on the surface of the AlGaN layer and another part of the anode is recessed within the AlGaN and directly exposed to the two-dimensional gas that arises at the AlGaN/GaN interface. The recessed portion of the anode advantageously reduces the turn-on voltage of the device. In addition, under a reverse bias, the portion of the anode located on the surface of the AlGaN layer will deplete the portion of the AlGaN layer directly below it, blocking the two-dimensional channel and thus maintaining an enhanced breakdown voltage.

Figure 4:
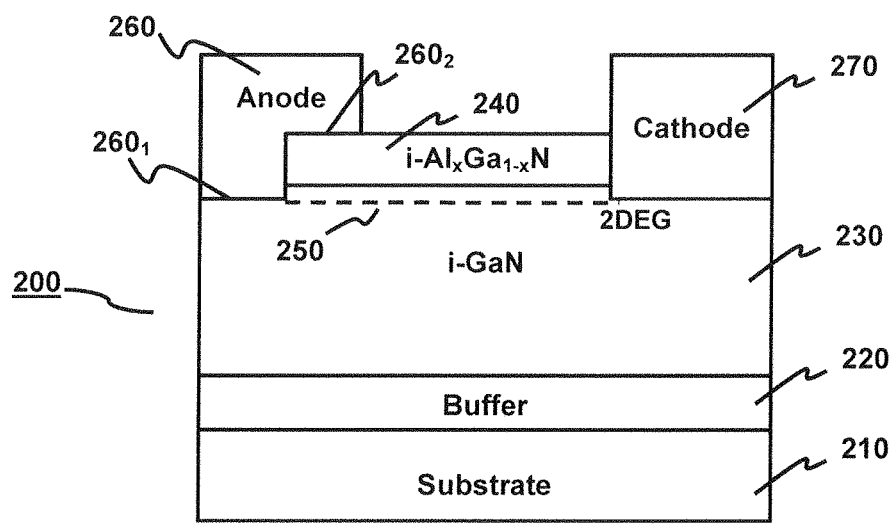
FIG. 4 shows one embodiment of a Schottky diode that employs a partially recessed anode.

FIG. 4 shows one embodiment of a Schottky diode 200 that employs a partially recessed anode. The diode 200 can be fabricated from many different material systems. The diode 200 is shown as a single device for ease of description and understanding, but the diodes are typically fabricated at a wafer level and then divided into individual devices. In some cases thousands of devices can be fabricated from a single wafer level process.

The diode 200 is fabricated using a Group-III nitride based material system. Group-III nitrides include the semiconductor compounds formed between nitrogen and the elements in Group-III of the periodic table, usually aluminum (Al), gallium (Ga), and indium (In). This group also includes ternary and tertiary compounds such as AlGaN and AlInGaN. For illustrative purposes the diodes described below are formed from GaN and AlGaN, although other Group-III nitrides may be employed as well.

The diode 200 includes a substrate 210 that may be formed from various materials such as sapphire, silicon or silicon carbide. Various techniques of fabrication may employ one or more layers of materials to be disposed between the substrate 210 and the first active layer 230. For example, in some cases a buffer layer 220 may be formed on the substrate 210. Buffer layer 220 may be formed from GaN, AlGaN, or aluminum nitride (AlN) and provides an interface from the non-GaN substrate to a GaN-based active structure. Buffer layer 220 can reduce the defect concentration in the active device layers. Buffer layer 220 may be considered as part of substrate 210, whereby the remaining layers as formed on buffer layer 220 may be considered as device layers of the structure. In the example of FIG. 4 a first active layer 230 is comprised of gallium nitride (GaN). In other examples, different semiconductor materials containing nitride compounds of other elements from Group III of the Periodic Table of the Elements may comprise the first active layer 230.

The second active layer 240 in the example of FIG. 4 is comprised of aluminum gallium nitride (AlGaN). In other examples, different Group III nitride semiconductor materials such aluminum indium nitride (AlInN) and aluminum indium gallium nitride (AlInGaN) may comprise the second active layer 240. The material of the second active layer 240 may be a non-stoichiometric compound. In such materials, the ratios of the elements are not easily represented by ordinary whole numbers. For example, the second active layer 240 may be a non-stoichiometric compound of a Group III nitride semiconductor material such as $Al_xGa_{1-x}N$ where $0<X<1$.

As charge transfers from the second active layer 240 to the first active layer 230 because of the difference in bandgap between the materials, a planar region of high-charge, high mobility electrons is formed in the first active layer 230 at the interface between first and second active layers 230 and 240. The region of electric charge is sometimes called a two-dimensional electron gas 250 because electrons confined in the quantum well that results from the polarization effects of the III-nitride hetero-structure are free to move in two dimensions but are tightly confined in the third dimension.

The amount of charge that transfers across the second active layer 240 to the first active layer 230 to form electron gas 250 depends on the thickness and material concentration (e.g., Al percent composition) of the second active layer 240, which initially determines the amount of electrons in electron gas 250. In one embodiment, the second active layer 240 is formed from an AlGaN layer having a thickness within a range of about 0.01-0.04 microns. The GaN layer may be doped n-type, whereby the n-type dopant can be incorporated uniformly within first active layer 230, or in part of the layer only. The n-type dopant impurity in GaN layer may be silicon, for example.

Electrodes are disposed on the device and establish electrical connections to the active layers. In particular, a cathode 270 is formed on the first active layer 230 and establishes an ohmic junction therewith. Cathode 270 may be formed from any suitable metal.

An anode 260 is in contact with the second active layer 240 and establishes a Schottky junction therewith. The anode 260 may be formed from any suitable material for establishing a Schottky junction such as a metal or metal gallicide. Suitable metals may include nickel (Ni), platinum (Pt), titanium (Ti) and gold (Au).

As shown, anode 260 includes a portion $260_1$ that is situated on the first active layer 230 and another portion $260_2$ that is situated within or on the second active layer 240. The AlGaN layer is completely removed below the recessed anode portion $260_1$ so that the recessed anode portion $260_1$ is in direct contact with the two-dimension electron gas. As a result the carriers can travel through a much lower potential barrier by thermionic emission as well as by tunneling. Therefore, the current density can increase significantly. Moreover, since the potential barrier is reduced, the forward voltage drop of the device is reduced.

Figure 5:
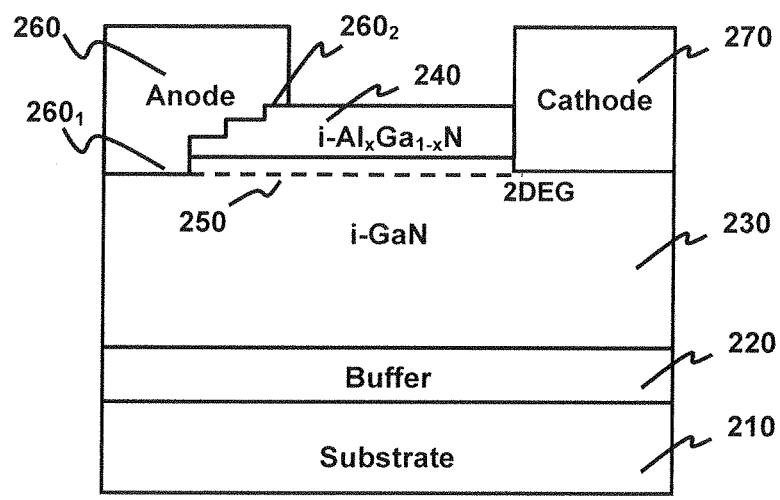
FIG. 5 shows an alternative embodiment of a Schottky diode that employs a partially recessed anode having configuration that is recessed in a stepwise manner.

As shown in FIG. 4, the etch depth at which the recessed anode portion $260_1$ is located within the AlGaN layer may be constant across the entire recessed portion $260_1$. Alternatively, in some cases the different segments of the recessed portion $260_1$ may be located at different depths within the AlGaN layer. For instance, as shown in FIG. 5, the recessed portion $260_1$ of the anode 260 may have a stepped configuration in which different segments are located at increasing depths within the AlGaN layer 240 (as viewed in a direction starting at the cathode and moving toward the anode). In FIGS. 4 and 5, as well as the figures that follow, like elements are denoted by like reference numerals. Simulations have shown that the anode configuration of FIG. 5 can suppress the leakage current and reduce the turn-on voltage.

Figure 6:
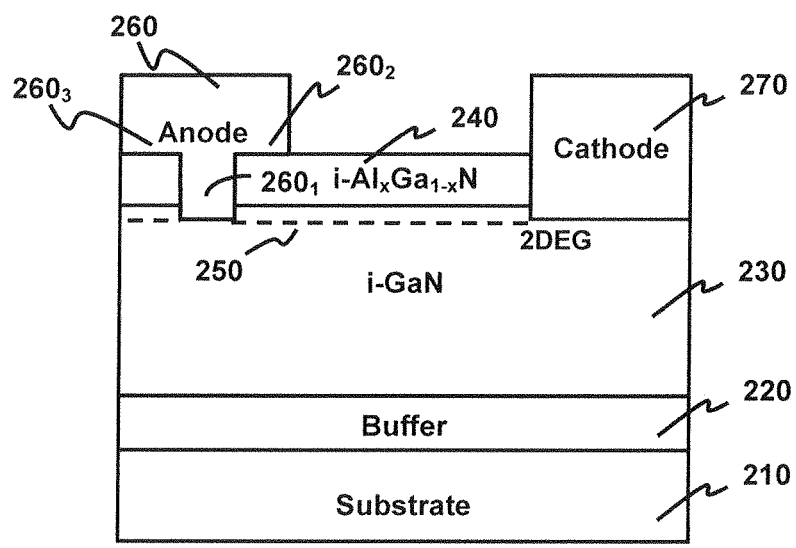
FIG. 6 shows another alternative embodiment of a Schottky diode that employs a partially recessed anode having a "T-shaped" configuration.

FIG. 6 shows another illustrative configuration of the partially recessed anode 260. In this example the partially recessed anode has a "T-shaped" configuration in which the recessed portion $260_1$ of the anode 260 is located between two surface portions $260_2$ and $260_3$ of the anode 260. Simulations have demonstrated that this configuration can also advantageously reduce the leakage current of the device.

Figure 7:
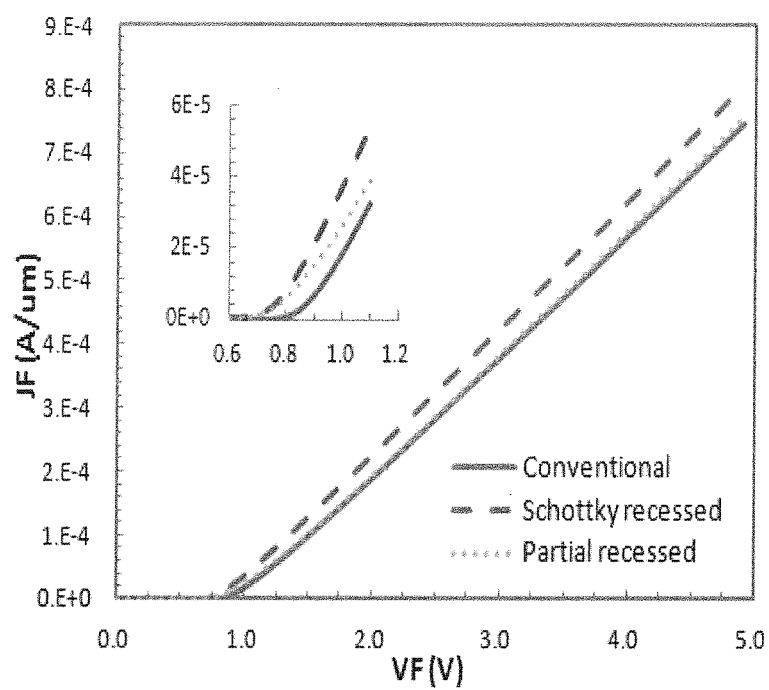
FIG. 7 shows a simulation of the forward I-V curves for a conventional AlGaN/GaN Schottky diode, a fully recessed Schottky diode and a partially recessed Schottky diode of the type shown in FIG. 4.

In some embodiments the surface area (i.e., the area of the surface parallel to the plane in which the substrate extends) occupied by the recessed portion $260_1$ of the anode 260 and the non-recessed portion $260_2$ are about equal to one another. In other embodiments these surface areas may differ from one another. For example, in some embodiments it may be advantageous to make the surface area of the recessed portion $260_1$ smaller than the surface area of the non-recessed portion $260_2$. Such a configuration may reduce the leakage current in some cases. In general, the relative size of the different anode portions will depend on the particular device characteristics and the application in which the device is to be employed. FIG. 7 shows a simulation of the forward I-V curves for a conventional AlGaN/GaN Schottky diode, a fully recessed Schottky diode and a partially recessed Schottky diode of the type shown in FIG. 4. Although at higher biases the forward current curves for the conventional and partially recessed Schottky diodes almost merge with one another, the onset of the turn-on voltage for the partially and fully recessed Schottky diodes are almost the same, and much lower than for the conventional device.

This behavior of the partially recessed diode can be explained as follows. At lower biases, the current conducting mechanism is dominated by the recessed anode portion $260_1$ which is in contact with the two-dimensional electron gas. At higher bias values, the majority of the electrons can traverse the AlGaN/GaN interface and the potential barrier becomes larger.

Figure 8:
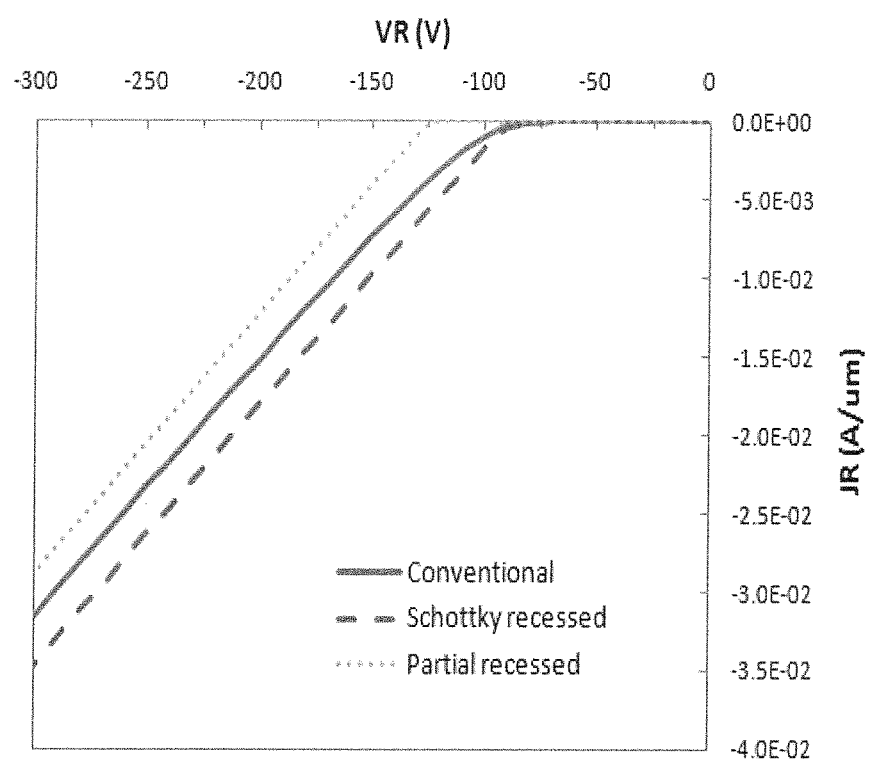
FIG. 8 shows a simulation of the reverse I-V curves for a conventional AlGaN/GaN Schottky diode, a fully recessed Schottky diode and a partially recessed Schottky diode of the type shown in FIG. 4.

FIG. 8 shows a simulation of the reverse I-V curves for a conventional AlGaN/GaN Schottky diode, a fully recessed Schottky diode and a partially recessed Schottky diode of the type shown in FIG. 4. As shown, the breakdown voltage of the partially recessed diode is significantly increased over both the conventional diode and the fully recessed diode. Moreover, the leakage current of the partially recessed diode is reduced at low bias values.

The GaN-based Schottky diode described herein may be fabricated using an epitaxial growth process. For instance, a reactive sputtering process may be used where the metallic constituents of the semiconductor, such as gallium, aluminum and/or indium, are dislodged from a metallic target disposed in close proximity to the substrate while both the target and the substrate are in a gaseous atmosphere that includes nitrogen and one or more dopants. Alternatively, metal organic chemical vapor deposition (MOCVD) may be employed, wherein the substrate is exposed to an atmosphere containing organic compounds of the metals as well as to a reactive nitrogen-containing gas, such as ammonia, and a dopant-containing gas while the substrate is maintained at an elevated temperature, typically around 700-1100 C. The gaseous compounds decompose and form a doped semiconductor in the form of a film of crystalline material on the surface of the substrate. The substrate and the grown film are then cooled. As a further alternative, other epitaxial growth methods, such as molecular beam epitaxy (MBE) or atomic layer epitaxy may be used. Yet additional techniques that may be employed include, without limitation, Flow Modulation Organometallic Vapor Phase Epitaxy (FM-OMVPE), Organometallic Vapor-Phase Epitaxy (OMVPE), Hydride Vapor-Phase Epitaxy (HVPE), and Physical Vapor Deposition (PVD).

Standard metallization techniques, as known in the art of semiconductor fabrication, can be used to form the partially recessed anode. Illustrative metals which may be used to form Schottky junction include, by way of example, Nb, Ti, Cr, W, Mo, Ag, Cu, Co, Au, Pd, Ni, and Pt. Schottky metals with different work functions result in different barrier potentials. The recess in the second active layer (e.g., an AlGaN layer) in which the recessed portion of the anode is located may be formed using well known etching processes such as reactive ion etching (RIE), inductively coupled plasma (ICP), or electron cyclotron resonance (ECR) plasma etching.

Figure 9:
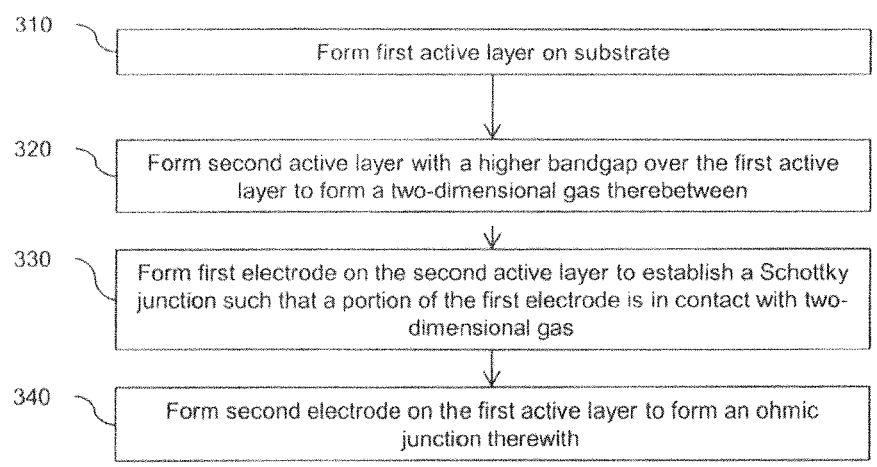
FIG. 9 is a flowchart showing one example of a method for forming a semiconductor device.

FIG. 9 is a flowchart showing one example of a method for forming a semiconductor device. The method includes forming a first active layer on a substrate at block 310. A second active layer is formed over the first active layer at block 320. The active layer has a higher bandgap than the first active layer such that a two-dimensional electron gas layer arises between the first active layer and the second active layer. A first electrode is formed on the second active layer at block 330 such that a Schottky junction is formed therewith. The first electrode has a first portion in contact with the two-dimensional gas. A second electrode is formed on the first active layer at block 340 to create an Ohmic junction therewith by direct metal deposition on the first active layer or by metal deposition on the second active layer plus an alloying process to reach the first active layer.

The above examples and disclosure are intended to be illustrative and not exhaustive. These examples and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

The invention claimed is:

1. A semiconductor device, comprising:
 a substrate;
 a first active layer disposed over the substrate; a second active layer disposed on the first active layer, the second active layer having a higher bandgap than the first active layer such that a two-dimensional electron gas layer arises between the first active layer and the second active layer;

a first electrode having a first portion disposed in a recess in the second active layer such that said second active layer is completely removed below the first portion of said first electrode, and a second portion disposed directly on the second active layer such that a Schottky junction is formed therewith, said first portion of the first electrode having a lower Schottky potential barrier than said second portion of the first electrode; and a second electrode in contact with the first active layer, said second electrode establishing an ohmic junction with the first active layer.

2. The semiconductor device of claim 1 wherein the first portion of the first electrode is in contact with the two-dimensional electron gas.

3. The semiconductor device of claim 1 wherein the first portion of the first electrode comprises a plurality of segments that are each located at a different depth within the recess in the second active layer.

4. The semiconductor device of claim 3 wherein the plurality of segments are located at different depths completely within said second active layer in a stepwise manner.

5. The semiconductor device of claim 1 in which the second portion of the first electrode disposed on the second active layer comprises first and second segments such that the first portion of the first electrode is disposed between the first and second segments of the first electrode.

6. The semiconductor device of claim 1 in which the first portion of the first electrode has a surface area parallel to a plane in which the substrate extends that is smaller than a surface area of the second portion of the first electrode, said surface area of the second portion of the first electrode being parallel to a plane which the substrate extends.

7. The semiconductor device of claim 1, wherein the first active layer comprises a group III nitride semiconductor material.

8. The semiconductor device of claim 7, wherein the first active layer comprises GaN.

9. The semiconductor device of claim 1, wherein the second active layer comprises a group III nitride semiconductor material.

10. The semiconductor device of claim 9, wherein the second active layer comprises $Al_XGa_{1-X}N$, wherein $0<X<1$.

11. The semiconductor device of claim 9, wherein the second active layer is selected from the group consisting of AlGaN, AlInN, and AlInGaN.

12. A method of forming a semiconductor device, comprising:

forming a first active layer on a substrate; forming a second active layer over the first active layer, the second active layer having a higher bandgap than the first active layer such that a two-dimensional electron gas layer arises between the first active layer and the second active layer;

forming a first electrode on the second active layer such that a Schottky junction is formed therewith, the first electrode having a first portion wherein the second active layer has been completely removed beneath the first portion, such that the first portion is in contact with the two-dimensional gas and a second portion disposed directly on the second active layer; and forming a second electrode on the first active layer to form an ohmic junction therewith.

13. The method of claim 12 wherein the first portion of the first electrode comprises a plurality of segments that are each located at a different depth within the recess in the second active layer.

14. The method of claim 13 wherein the plurality of segments are located at different depths completely within said second active layer in a stepwise manner.

15. The method of claim 12 in which the second portion of the first electrode disposed on the second active layer comprises first and second segments such that the first portion of the first electrode is disposed between the first and second segments of the first electrode.

16. The method of claim 12 in which the first portion of the first electrode has a surface area parallel to a plane in which the substrate extends that is smaller than a surface area of the second portion of the first electrode, said surface area of the second portion of the first electrode being parallel to a plane which the substrate extends.

17. The method of claim 12, wherein the first active layer comprises a group III nitride semiconductor material.

18. The method of claim 17, wherein the first active layer comprises GaN.

19. The method of claim 12, wherein the second active layer comprises a group III nitride semiconductor material.

20. The method of claim 19, wherein the second active layer comprises $Al_XGa_{1-X}N$, wherein $0<X<1$.

* * * * *